United States Patent
Yoshida

(10) Patent No.: US 9,831,381 B2
(45) Date of Patent: Nov. 28, 2017

(54) PACKAGE SUBSTRATE MACHINING METHOD

(71) Applicant: DISCO CORPORATION, Tokyo (JP)

(72) Inventor: Yuta Yoshida, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/248,097

(22) Filed: Aug. 26, 2016

(65) Prior Publication Data

US 2017/0077347 A1 Mar. 16, 2017

(30) Foreign Application Priority Data

Sep. 14, 2015 (JP) ................................. 2015-181097

(51) Int. Cl.
*H01L 33/00* (2010.01)

(52) U.S. Cl.
CPC ................................ *H01L 33/0095* (2013.01)

(58) Field of Classification Search
None
See application file for complete search history.

(56) References Cited

U.S. PATENT DOCUMENTS

| 2009/0298234 A1* | 12/2009 | Lee | B28D 5/00 |
| | | | 438/114 |
| 2014/0120699 A1* | 5/2014 | Hua | H01L 21/78 |
| | | | 438/463 |

FOREIGN PATENT DOCUMENTS

JP 2010-172900 8/2010

* cited by examiner

*Primary Examiner* — Asok K Sarkar
(74) *Attorney, Agent, or Firm* — Greer Burns & Crain Ltd.

(57) ABSTRACT

A package substrate machining method is provided. The package substrate includes a ceramic substrate, a plurality of device chips arranged on one face of the ceramic substrate, and a coating layer made of a resin that covers the entire one face of the ceramic substrate. The package substrate machining method includes a first laser-machined groove formation step adapted to form, in the coating layer, first laser-machined grooves along scheduled division lines set up on the package substrate by irradiating a laser beam at a wavelength absorbable by the coating layer from the coating layer side of the package substrate; and a second laser-machined groove formation step adapted to form, in the ceramic substrate and after the first laser-machined groove formation step, second laser-machined grooves along the scheduled division lines by irradiating a laser beam from the ceramic substrate side of the package substrate.

3 Claims, 3 Drawing Sheets

PACKAGE SUBSTRATE MACHINING METHOD

BACKGROUND OF THE INVENTION

Field of the Invention

The present invention relates to a machining method of a package substrate having light emitting diodes (LEDs) or other chips sealed thereon.

Description of the Related Art

When LEDs or other chips are packaged, a plurality of device chips are arranged on a front face of a ceramic substrate made, for example, of $Al_2O_3$ first, and a front face side of this ceramic substrate is coated with a light-transmitting mold resin, thus forming a package substrate. A plurality of device packages, each having a device chip packaged, can be obtained by dividing the package substrate along scheduled division lines (streets) set up between adjacent device chips.

The above division of a package substrate is conducted, for example, by a method based on abrasion using laser beams. However, this method highly likely results in degraded device chip quality due to sticking of a molten material, produced by abrasion, to a rear face side of the ceramic substrate. For this reason, a method is proposed that forms grooves along scheduled division lines on the rear face side of the ceramic substrate to accommodate the molten material, before the package substrate is machined (refer, for example, to Japanese Patent Laid-Open No. 2010-172900).

SUMMARY OF THE INVENTION

However, although the above method makes it less likely for the molten material to stick to the rear face side of the ceramic substrate, the molten material accommodated in the grooves remains and becomes stuck in an as-is manner on side faces of the device packages obtained by dividing the package substrate.

In light of the foregoing, it is an object of the present invention to provide a package substrate machining method that prevents sticking of a molten material to device packages.

In accordance with an aspect of the present invention, there is provided a package substrate machining method for machining a package substrate that includes a ceramic substrate, a plurality of device chips, and a coating layer. The plurality of device chips are arranged on one face of the ceramic substrate. The coating layer is made of a resin that covers the entire one face of the ceramic substrate. The package substrate machining method includes first and second laser-machined groove formation steps. The first laser-machined groove formation step forms, in the coating layer, first laser-machined grooves along scheduled division lines set up on the package substrate by irradiating a laser beam at a wavelength absorbable by the coating layer from the coating layer side of the package substrate. The second laser-machined groove formation step forms, in the ceramic substrate and after the first laser-machined groove formation step, second laser-machined grooves along the scheduled division lines by irradiating a laser beam at a wavelength absorbable by the ceramic substrate from the ceramic substrate side of the package substrate.

In the present invention, it is preferred that the method further include a cleaning step after the second laser-machined groove formation step to immerse the package substrate in a liquid subjected to ultrasound for cleaning.

Further, in the present invention, the package substrate having LEDs as the device chips may be machined.

In the package substrate machining method according to the present invention, the second laser-machined grooves are formed by irradiating a laser beam from the ceramic substrate side of the package substrate after formation of the first laser-machined grooves in the resin coating layer that covers the ceramic substrate. Therefore, the majority of the molten material produced from the ceramic substrate is accommodated in the first laser-machined grooves formed in the coating layer. The coating layer is made of a resin. This makes it unlikely that the molten material produced from the ceramic substrate may become stuck in the first laser-machined grooves. As a result, the molten material can be removed by a simple cleaning step. Thus, the package substrate machining method according to the present invention prevents sticking of a molten material formed as a result of machining of a package substrate to device packages.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A description will be given of an embodiment of the present invention with reference to the accompanying drawings. A package substrate machining method according to the present embodiment includes a first laser-machined groove formation step (refer to FIG. 3A), a second laser-machined groove formation step (refer to FIG. 3B), and a cleaning step. In the first laser-machined groove formation step, first laser-machined grooves are formed in a resin coating layer along scheduled division lines (streets) set up in a package substrate by irradiating a laser beam at a wavelength readily absorbed by the coating layer. The coating layer covers a first face of a ceramic substrate. It should be noted that the first laser-machined grooves are formed in such a manner as to reach an interface with the ceramic substrate from a front face side where the coating layer is exposed. In the second laser-machined groove formation step, second laser-machined grooves are formed along the scheduled division lines in the ceramic substrate by irradiating a laser beam at a wavelength readily absorbed by the ceramic substrate. It should be noted that the second laser-machined grooves are formed in such a manner as to reach the first face of the ceramic substrate from a second face side thereof. In the cleaning step, the package substrate is immersed in a liquid subjected to ultrasound for cleaning. The coating layer is made of a resin. As a result, a molten material produced from the ceramic substrate does not easily become stuck thereto. This cleaning step readily removes the molten material remaining in the first laser-machined grooves. A detailed description will be given below of the package substrate machining method according to the present embodiment.

Figure 1:
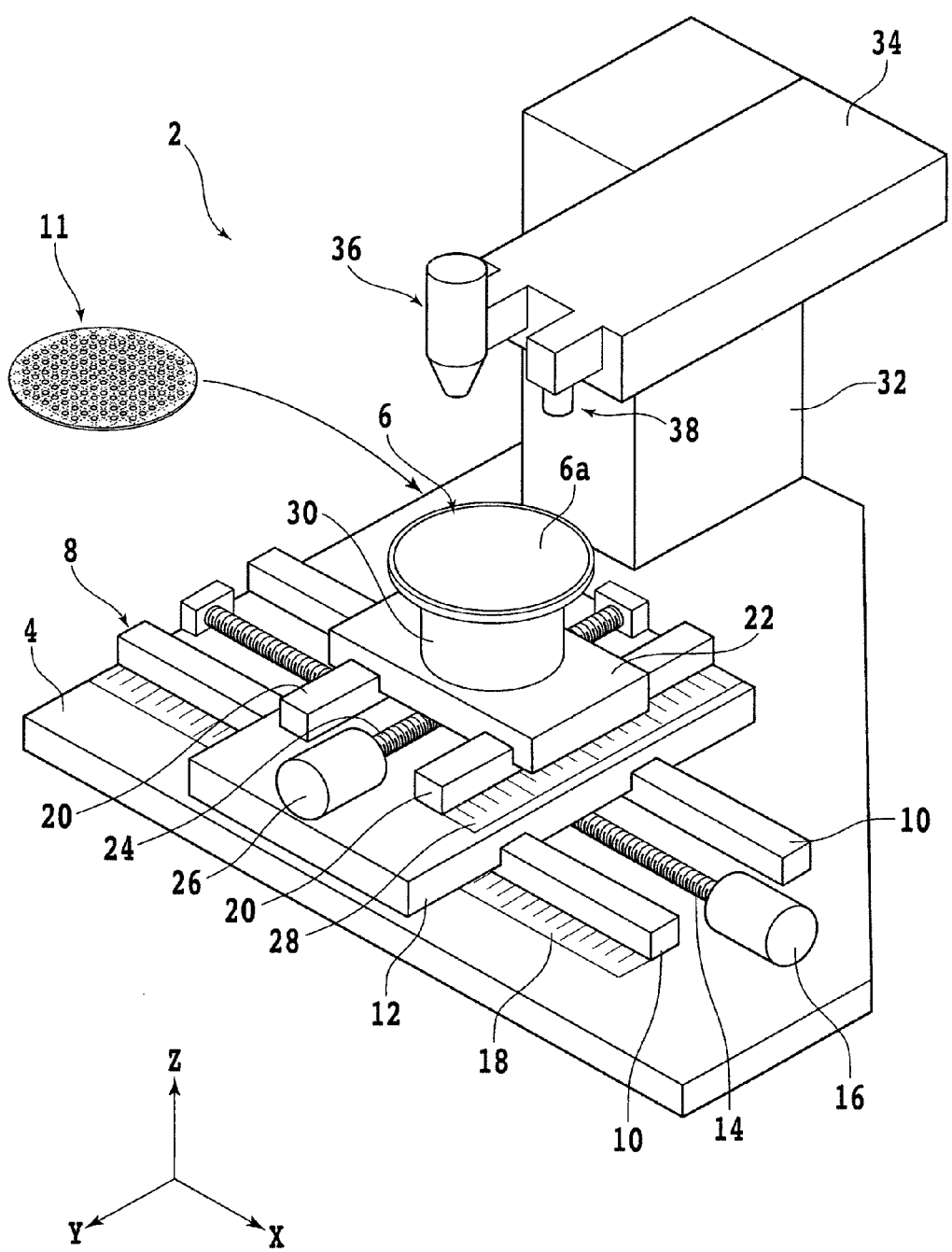
FIG. 1 is a perspective view schematically illustrating a configuration example of a laser machining apparatus used for a package substrate machining method.

A description will be given first of a configuration example of a laser machining apparatus used for the package substrate machining method. FIG. 1 is a perspective view schematically illustrating a configuration example of a laser machining apparatus used for the package substrate machining method. As illustrated in FIG. 1, a laser machining apparatus 2 according to the present embodiment includes a base 4 on which each structure is installed.

A horizontal movement mechanism 8 is provided on an upper face of the base 4 to move a chuck table 6 in the X-axis direction (machining feed direction) and Y-axis direction (indexing feed direction). The horizontal movement mechanism 8 includes a pair of X-axis guide rails 10 that are fastened to the upper face of the base 4 and parallel to the X-axis direction. An X-axis movement table 12 is slidably attached to the X-axis guide rails 10. A nut section (not shown) is provided on a rear face side (lower face side) of the X-axis movement table 12. An X-axis ball screw 14 parallel to the X-axis guide rails 10 is screwed into this nut section. The X-axis ball screw 14 has its one end portion coupled to an X-axis pulse motor 16. As the X-axis ball screw 14 is rotated by the X-axis pulse motor 16, the X-axis movement table 12 moves in the X-axis direction along the X-axis guide rails 10. An X-axis scale 18 is provided adjacent to the X-axis guide rail 10 to detect the position of the X-axis movement table 12 in the X-axis direction.

A pair of Y-axis guide rails 20 parallel to the Y-axis direction are fastened to the front face (upper face) of the X-axis movement table 12. A Y-axis movement table 22 is slidably attached to the Y-axis guide rails 20. A nut section (not shown) is provided on the rear face side (lower face side) of the Y-axis movement table 22. A Y-axis ball screw 24 parallel to the Y-axis guide rails 20 is screwed into this nut section. The Y-axis ball screw 24 has its one end portion coupled to a Y-axis pulse motor 26. As the Y-axis ball screw 24 is rotated by the Y-axis pulse motor 26, the Y-axis movement table 22 moves in the Y-axis direction along the Y-axis guide rails 20. A Y-axis scale 28 is provided adjacent to the Y-axis guide rail 20 to detect the position of the Y-axis movement table 22 in the Y-axis direction.

Figure 2A:
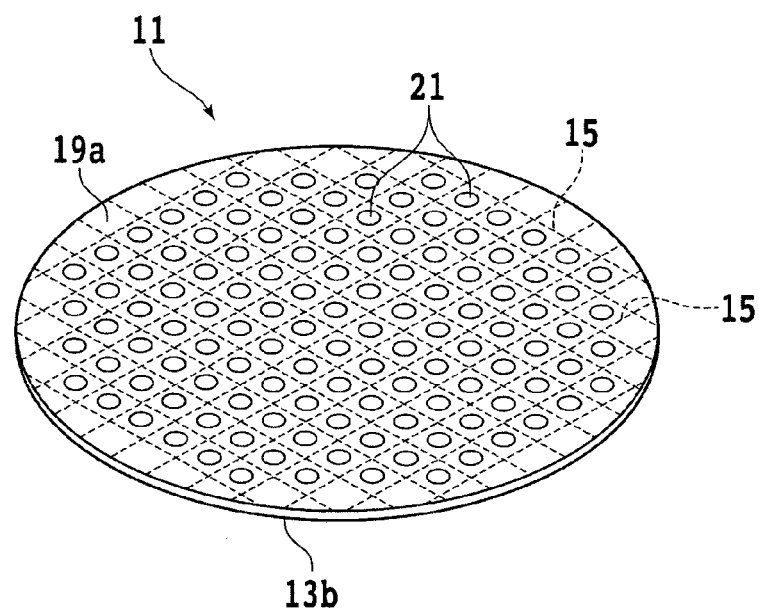
FIG. 2A is a perspective view schematically illustrating a configuration example of a package substrate.
Figure 2B:
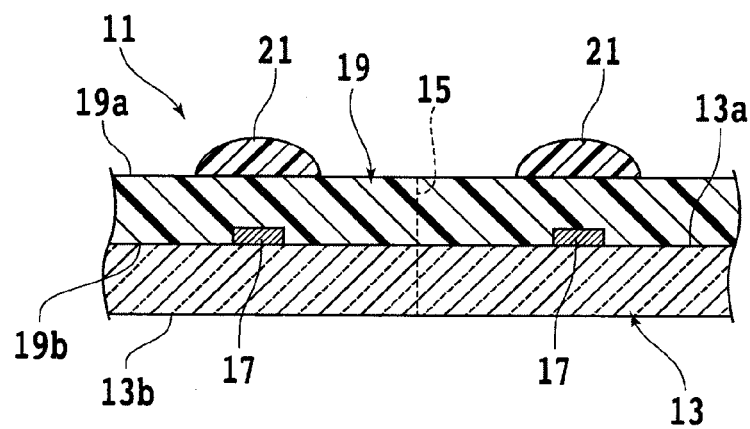
FIG. 2B is a sectional view schematically illustrating a configuration example of a package substrate.

A support 30 is provided on the front face side (upper face side) of the Y-axis movement table 22. The chuck table 6 is arranged on the upper portion of the support 30 to suck and hold a package substrate 11. FIG. 2A is a perspective view schematically illustrating a configuration example of the package substrate 11. FIG. 2B is a sectional view schematically illustrating a configuration example of the package substrate 11.

As illustrated in FIGS. 2A and 2B, the package substrate 11 in the present embodiment includes a circular ceramic substrate 13 made of an inorganic material such as $Al_2O_3$ or AlN that has excellent heat radiation capability. The ceramic substrate 13 is partitioned into a plurality of areas by a plurality of scheduled division lines (streets) 15 that intersect each other, with an LED (light-emitting element, device chip) 17 arranged on the side of a first face (one face) 13a of each area. The LEDs 17 are sealed by a coating layer 19 that covers the side of the entire first face 13a of the ceramic substrate 13. The coating layer 19 is made of a resin such as silicone or epoxy and transmits light radiated from the LEDs 17. A dome-shaped lens 21 is arranged on a front face 19a of the coating layer 19 for each of the device chips 17, and light radiated from the LEDs 17 is collected by the lenses 21. It should be noted that device chips other than LEDs may be arranged on the first face 13a of the ceramic substrate 13. Further, in this case, the coating layer 19 may be made of a material that does not easily transmit light, for example, to omit the lenses 21. There are no limitations on the material, shape, and other properties of the ceramic substrate 13. A rectangular ceramic substrate, for example, may be used.

As illustrated in FIG. 1, the front face (upper face) of the chuck table 6 is a holding face 6a that sucks and holds the above package substrate 11. The holding face 6a is connected to a suction source (not shown) via a suction channel (not shown) formed inside the chuck table 6. A rotation drive mechanism (not shown) is provided under the chuck table 6. The chuck table 6 rotates about a rotation shaft that runs parallel to the Z-axis direction thanks to this rotation drive mechanism.

A pillar-shaped support structure 32 is provided behind the horizontal movement mechanism 8. A support arm 34 extending in the Y-axis direction is fastened to the upper portion of the support structure 32. A laser irradiation unit 36 is provided at a tip portion of the support arm 34. The laser irradiation unit 36 irradiates a laser beam, generated by pulsed oscillation, onto the package substrate 11 on the chuck table 6. A camera 38 is provided adjacent to the laser irradiation unit 36 to image the upper face side of the package substrate 11 (front face 19a of the coating layer 19). An image formed by imaging, for example, the package substrate 11, with the camera 38 is used to adjust the positions of the package substrate 11 and the laser irradiation unit 36 relative to each other.

The chuck table 6, the horizontal movement mechanism 8, the laser irradiation unit 36, the camera 38, and other components are connected to a control unit (not shown). The control unit controls the operation of each component such that the package substrate 11 is machined properly.

Figure 3A:
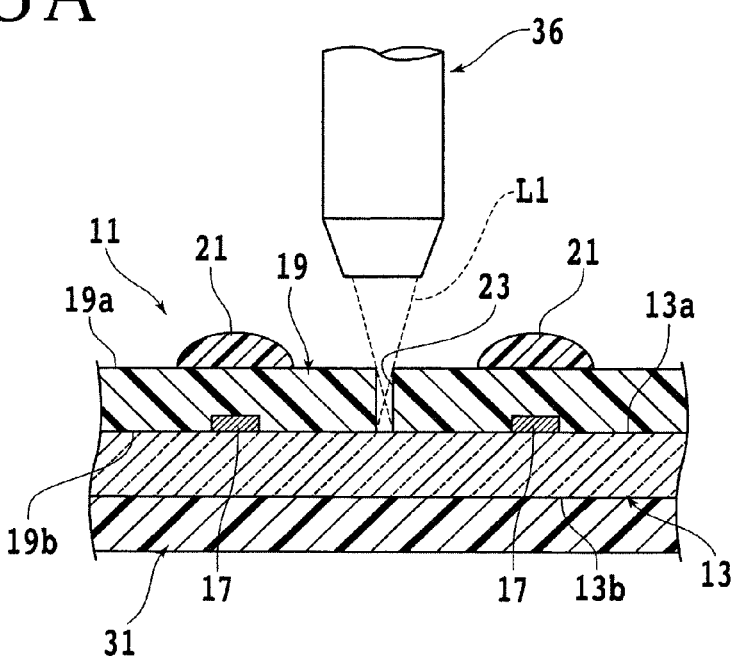
FIG. 3A is a sectional view schematically illustrating a first laser-machined groove formation step.

A description will be given next of the package substrate machining method according to the present embodiment. In the package substrate machining method according to the present embodiment, a first laser-machined groove formation step is performed first to form first laser-machined grooves on the coating layer 19. FIG. 3A is a sectional view schematically illustrating the first laser-machined groove formation step.

In the first laser-machined groove formation step, adhesive tape 31 is applied to a second face 13b of the ceramic substrate 13 first. Next, the package substrate 11 is placed on the chuck table 6 such that the adhesive tape 31 is opposed to the holding face 6a, and a negative pressure is applied to the holding face 6a from the suction source. As a result, the package substrate 11 is sucked and held by the chuck table 6 with the front face 19a of the coating layer 19 exposed upward. Next, the chuck table 6 is moved and rotated such that the laser irradiation unit 36 is aligned above the target scheduled division line 15. Then, as illustrated in FIG. 3A, the chuck table 6 is moved parallel to the target scheduled division line 15 while at the same time irradiating a laser beam L1 at a wavelength readily absorbed by the coating layer 19 (absorbable wavelength) onto the coating layer 19. That is, the laser beam L1 at a wavelength readily absorbed by the coating layer 19 is irradiated along the scheduled division line 15 from the side of the coating layer 19 of the package substrate 11. As a result, the coating layer 19 is abraded by the laser beam L1, thus forming a first laser-machined groove 23 along the scheduled division line 15.

For example, the machining conditions for forming the first laser-machined groove 23 in the coating layer 19 of 50 μm to 300 μm in thickness are specified as follows:
Wavelength: 9.3 μm to 9.4 μm
Repetition frequency: 100 kHz
Movement speed (machining feed rate): 180 mm/s
Output: 16.2 W
Machining count: Twice (2 passes)

It should be noted, however, that the machining conditions are not limited thereto. It is only necessary to adjust the machining conditions to the extent that the first laser-machined groove 23 having at least a depth reaching an interface 19b of the coating layer 19 on the side of the ceramic substrate 13 can be formed. The first laser-machined groove formation step ends when the first laser-machined grooves 23 are formed along all the scheduled division lines 15 as a result of repetition of the above steps.

Figure 3B:
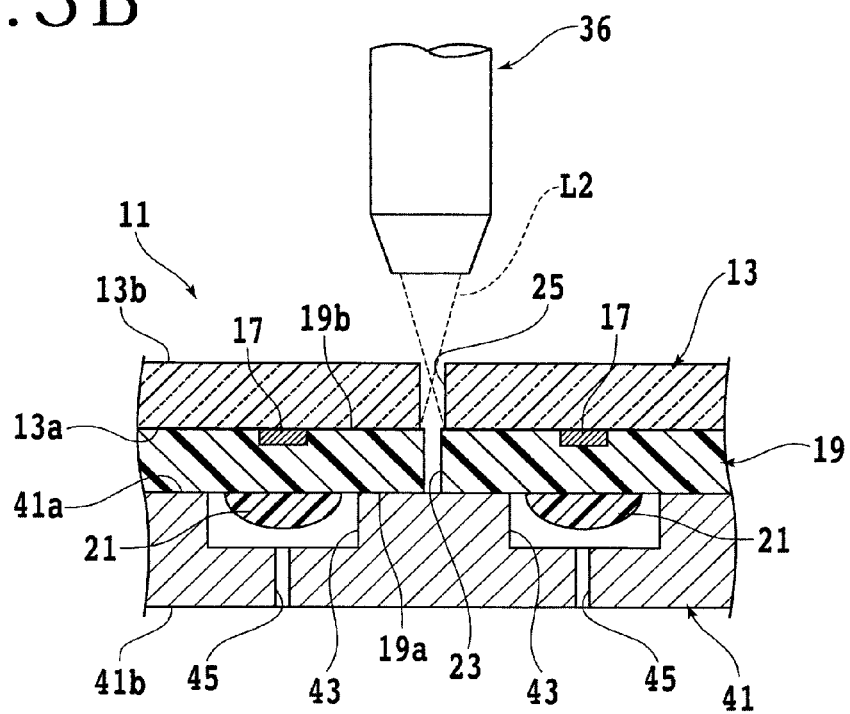
FIG. 3B is a sectional view schematically illustrating a second laser-machined groove formation step.

The second laser-machined groove formation step is performed after the first laser-machined groove formation step to form second laser-machined grooves in the ceramic substrate 13. FIG. 3B is a sectional view schematically illustrating the second laser-machined groove formation step.

In the second laser-machined groove formation step, the adhesive tape 31 is peeled off the package substrate 11 first. Further, a jig 41 for the package substrate 11 is placed on the holding face 6a of the chuck table 6. Recessed portions 43, each for one of the lenses 21 on the package substrate 11, are formed on the side of an upper face 41a of the jig 41. A suction channel 45 reaching a lower face 41b of the jig 41 is connected to a bottom of each of the recessed portions 43. Next, the package substrate 11 is placed on the jig 41 such that the front face 19a of the coating layer 19 is opposed to the upper face 41a of the jig 41, after which a negative pressure is applied to the holding face 6a of the chuck table 6 from the suction source. As a result, the package substrate 11 is sucked and held by the chuck table 6 with the second face 13b of the ceramic substrate 13 exposed upward. Next, the chuck table 6 is moved and rotated such that the laser irradiation unit 36 is aligned above the target scheduled division line 15. Then, as illustrated in FIG. 3B, the chuck table 6 is moved parallel to the target scheduled division line 15 while at the same time irradiating a laser beam L2 at a wavelength readily absorbed by the ceramic substrate 13 (absorbable wavelength) onto the ceramic substrate 13. That is, the laser beam L2 at a wavelength readily absorbed by the ceramic substrate 13 is irradiated along the scheduled division line 15 from the side of the ceramic substrate 13 of the package substrate 11. As a result, the ceramic substrate 13 is abraded by the laser beam L2, thus forming a second laser-machined groove 25 along the scheduled division line 15.

For example, the machining conditions for forming the second laser-machined groove 25 in the ceramic substrate 13 of 100 μm to 1200 μm in thickness are specified as follows:
Wavelength: 1064 nm
Repetition frequency: 100 kHz
Movement speed (machining feed rate): 80 mm/s
Output: 200 W
Machining count: Once (1 pass)

It should be noted, however, that the machining conditions are not limited thereto. It is only necessary to adjust the machining conditions to the extent that the second laser-machined groove 25 having at least a depth reaching the first face 13a of the ceramic substrate 13 can be formed. The second laser-machined groove formation step ends when the second laser-machined grooves 25 are formed along all the scheduled division lines 15 and the package substrate 11 is divided into multiple device pages as a result of repetition of the above steps.

A cleaning step is performed after the second laser-machined groove formation step to immerse the package substrate 11 (device package) in pure water (liquid) subjected to ultrasound for cleaning. In the present embodiment, the second laser-machined grooves 25 are formed in the ceramic substrate 13 after formation of the first laser-machined grooves 23 in the coating layer 19. Therefore, the majority of a molten material produced from the ceramic substrate 13 is accommodated in the first laser-machined grooves 23 formed in the coating layer 19. Further, the coating layer 19 is made of a resin. This makes it unlikely that the molten material produced from the ceramic substrate 13 may become stuck to the coating layer 19. As a result, ultrasonic cleaning of the package substrate 11 in the cleaning step readily removes the molten material remaining in the first laser-machined grooves 23. It should be noted that the cleaning step may be performed by a method other than ultrasonic cleaning.

Thus, in the package substrate machining method according to the present embodiment, the second laser-machined grooves 25 are formed in the ceramic substrate 13 by irradiating the laser beam L2 from the side of the ceramic substrate 13 of the package substrate 11 after formation of the first laser-machined grooves 23 in the coating layer 19 made of a resin that covers the ceramic substrate 13. Therefore, the majority of a molten material produced from the ceramic substrate 13 is accommodated in the first laser-machined grooves 23 formed in the coating layer 19. The coating layer 19 is made of a resin. This makes it unlikely that the molten material produced from the ceramic substrate 13 may become stuck in the first laser-machined grooves 23. As a result, the molten material can be removed by a simple cleaning step. Thus, the package substrate machining method according to the present embodiment prevents sticking of a molten material to device packages formed by machining the package substrate 11.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A package substrate machining method for machining a package substrate that includes a ceramic substrate, a plurality of device chips arranged on one face of the ceramic substrate, and a coating layer made of a resin that covers the entire one face of the ceramic substrate, the package substrate machining method comprising:
a first laser-machined groove formation step adapted to form, in the coating layer, first laser-machined grooves along scheduled division lines set up on the package substrate by irradiating a laser beam at a wavelength absorbable by the coating layer from the coating layer side of the package substrate; and
a second laser-machined groove formation step adapted to form, in the ceramic substrate and after the first laser-machined groove formation step, second laser-machined grooves along the scheduled division lines by irradiating a laser beam at a wavelength absorbable by the ceramic substrate from the ceramic substrate side of the package substrate.

2. The package substrate machining method according to claim 1, further comprising a cleaning step after the second laser-machined groove formation step to immerse the package substrate in a liquid subjected to ultrasound for cleaning.

3. The package substrate machining method according to claim 1, wherein the package substrate having light emitting diodes as the device chips is machined.

\* \* \* \* \*